United States Patent
Duan et al.

(10) Patent No.: US 11,302,886 B2
(45) Date of Patent: Apr. 12, 2022

(54) PEROVSKITE LIGHT-EMITTING DEVICE, PREPARATION METHOD THEREOF, AND DISPLAY

(71) Applicant: Shenzhen China Star Optoelectronics Semiconductor Display Technology Co., Ltd., Guangdong (CN)

(72) Inventors: Miao Duan, Guangdong (CN); Chiayu Lee, Guangdong (CN); Chunche Hsu, Guangdong (CN); Yongming Yin, Guangdong (CN); Yongwei Wu, Guangdong (CN); Pei Jiang, Guangdong (CN); Bo He, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 148 days.

(21) Appl. No.: 16/759,477

(22) PCT Filed: Dec. 24, 2019

(86) PCT No.: PCT/CN2019/127704
§ 371 (c)(1),
(2) Date: Apr. 27, 2020

(87) PCT Pub. No.: WO2021/114387
PCT Pub. Date: Jun. 17, 2021

(65) Prior Publication Data
US 2021/0408428 A1 Dec. 30, 2021

(30) Foreign Application Priority Data
Dec. 10, 2019 (CN) .......................... 201911254904.6

(51) Int. Cl.
*H01L 51/50* (2006.01)
*H01L 51/56* (2006.01)
*H01L 51/00* (2006.01)

(52) U.S. Cl.
CPC ...... *H01L 51/5088* (2013.01); *H01L 51/5092* (2013.01); *H01L 51/56* (2013.01);
(Continued)

(58) Field of Classification Search
CPC ............. H01L 51/5088; H01L 51/5092; H01L 51/0048; H01L 51/5012
See application file for complete search history.

(56) References Cited

U.S. PATENT DOCUMENTS

2014/0131868 A1   5/2014   Kippelen
2014/0202517 A1   7/2014   Kippelen et al.
(Continued)

FOREIGN PATENT DOCUMENTS

CN      1667465 A    9/2005
CN    105304829 A    2/2016
(Continued)

*Primary Examiner* — Anthony Ho

(57) ABSTRACT

The present application discloses a perovskite light-emitting device, a preparation method thereof, and a display. The perovskite light-emitting device includes a first injection layer, a first transport layer, a light-emitting layer, a second transport layer, and a second injection layer, which are sequentially stacked, wherein the first injection layer includes indium tin oxide, the second injection layer includes carbon nanotubes, the light-emitting layer includes halide perovskite, and light emitted by the light-emitting layer is simultaneously emitted from the first injection layer and the second injection layer. The perovskite light-emitting device of the present application can stably emit light on double sides.

10 Claims, 4 Drawing Sheets

(52) U.S. Cl.
CPC ...... *H01L 51/0048* (2013.01); *H01L 51/5012* (2013.01); *H01L 2251/308* (2013.01); *H01L 2251/5323* (2013.01)

(56) References Cited

U.S. PATENT DOCUMENTS

| | | |
|---|---|---|
| 2017/0148953 A1 | 5/2017 | Kim |
| 2019/0067396 A1 | 2/2019 | Cheng et al. |
| 2019/0165291 A1 | 5/2019 | Chen |
| 2020/0255727 A1 | 8/2020 | Han |

FOREIGN PATENT DOCUMENTS

| | | |
|---|---|---|
| CN | 106784336 A | 5/2017 |
| CN | 107104194 A | 8/2017 |
| CN | 107507918 A | 12/2017 |
| CN | 107994124 A | 5/2018 |
| CN | 108336107 A | 7/2018 |
| CN | 108493343 A | 9/2018 |
| CN | 110387227 A | 10/2019 |
| CN | 110416410 A | 11/2019 |
| CN | 110534659 A | 12/2019 |

∘ electron

PEROVSKITE LIGHT-EMITTING DEVICE, PREPARATION METHOD THEREOF, AND DISPLAY

BACKGROUND OF INVENTION

Field of Invention

The present application relates to a field of display technology, and particularly to a perovskite light-emitting device, a preparation method thereof, and a display.

Description of Prior Art

Light-emitting diodes are currently the most popular materials and technologies in a field of light emission and display. With the advancement of science and technology, transparent display technology has become the development trend of future displays, so there is a higher demand for performance parameters such as color purity, brightness, and luminous efficiency of the light-emitting diodes.

Organic light-emitting diodes are the most mentioned in the field of current transparent display technology. Transparent display technology based on organic light-emitting diodes has been developing rapidly and has become a research hotspot. However, the organic light-emitting diodes have low color purity due to the use of organic materials, and require color filters to produce pure colors.

Therefore, it is currently a problem to prepare a transparent light-emitting diode with high color purity.

SUMMARY OF INVENTION

The present application provides a perovskite light-emitting device, a preparation method thereof, and a display, so as to solve the problem of low color purity of the organic light-emitting diode in the prior art.

In order to solve the above technical problem, a technical solution adopted by the present application is to provide a perovskite light-emitting device, which includes a first injection layer, a first transport layer, a light-emitting layer, a second transport layer, and a second injection layer, which are sequentially stacked, wherein the first injection layer includes indium tin oxide, the second injection layer includes carbon nanotubes, the light-emitting layer includes halide perovskite, and light emitted by the light-emitting layer is simultaneously emitted from the first injection layer and the second injection layer.

In order to solve the above technical problem, another technical solution adopted by the present application is to provide a method of preparing a perovskite light-emitting device. The method includes: magnetron sputtering indium tin oxide on a substrate to obtain a first injection layer; disposing a first transport layer on the first injection layer; spin-coating halide perovskites on the first transport layer to obtain a light-emitting layer; providing a second transport layer on the light-emitting layer; and dropping an ink of carbon nanotubes on the second transport layer to form a second injection layer, so as to obtain the perovskite light-emitting device, wherein light emitted by the light-emitting layer is simultaneously emitted from the first injection layer and the second injection layer.

In order to solve the above technical problem, another technical solution adopted by the present application is to provide a display including the above-mentioned perovskite light-emitting device.

The beneficial effects of the present application are: in the present application, the indium tin oxide with transparent and conductive properties is used as the first injection layer, and the carbon nanotubes are used as the second injection layer. The carbon nanotubes themselves have good conductivity and stability, and when the carbon nanotubes are coated on the second transport layer, a conductive mesh structure is formed, wherein different carbon nanotubes are staggered and overlapped with each other, so that electrons can not only be transported along the direction of the carbon nanotubes themselves, but also can be transported to other carbon nanotubes through the contact sites, and thus the electrons move throughout the carbon nanotubes, to achieve good electrical conductivity of the electrodes, while the holes between different carbon nanotubes allow light to pass through, thereby achieving light transmission. In addition, by introducing the halide perovskite as the light-emitting layer, which has high fluorescence quantum efficiency, adjustable optical band gap, and high color purity, the light-emitting layer thus produced has excellent color purity. The light emitted by the light-emitting layer is emitted from the first injection layer and the second injection layer at the same time, thereby achieving the effect of double-sided light emission.

DETAILED DESCRIPTION OF PREFERRED EMBODIMENTS

The technical solutions in the embodiments of the present application will be clearly and completely described below. Obviously, the described embodiments are only a part of the embodiments of the present application, but not all of the embodiments. Based on the embodiments in the present application, all other embodiments obtained by a person of ordinary skill in the art without creative efforts shall fall within the protection scope of the present application.

Reference throughout this specification to "one embodiment" or "an embodiment" means that a particular feature, structure, or characteristic described in conjunction with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
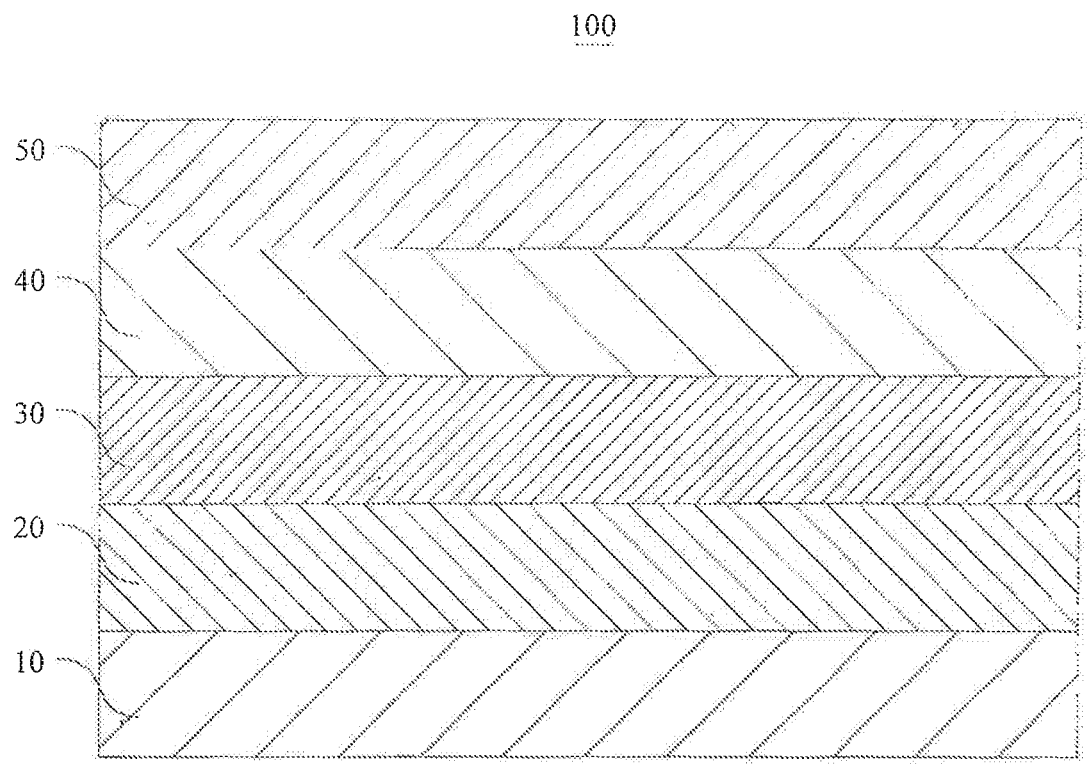
FIG. 1 is a schematic cross-sectional view of a perovskite light-emitting device provided by an embodiment of the present application.
Figure 2:
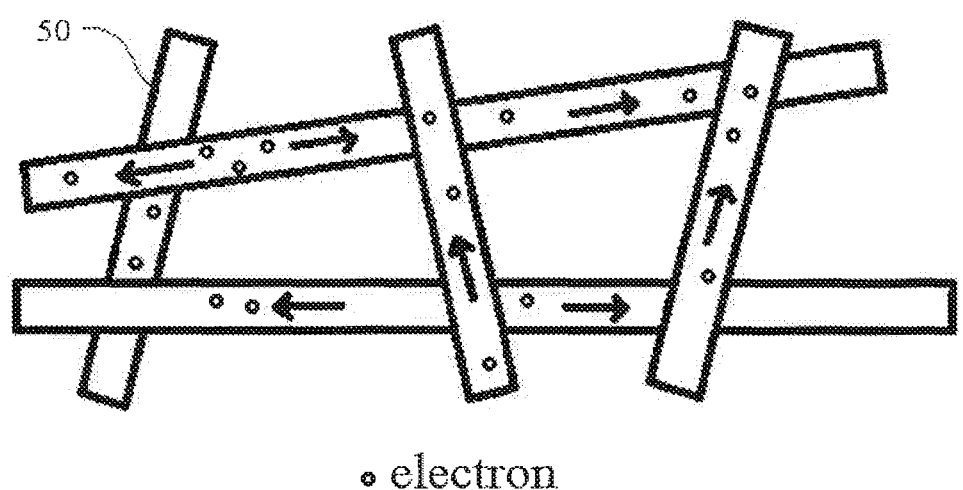
FIG. 2 is a schematic diagram of a carbon nanotube conductive mesh provided by an embodiment of the present application.

Referring to FIGS. 1 and 2, FIG. 1 is a schematic cross-sectional view of a perovskite light-emitting device 100 provided in an embodiment of the present application, and FIG. 2 is a schematic diagram of a carbon nanotube conductive mesh provided by an embodiment of the present application.

The present application provides a perovskite light-emitting device 100. The perovskite light-emitting device 100 is an inorganic light-emitting LED device.

The perovskite light-emitting device 100 includes a first injection layer 10, a first transport layer 20, a light-emitting layer 30, a second transport layer 40, and a second injection layer 50, which are stacked sequentially. The first injection layer 10 includes indium tin oxide. The second injection layer 50 includes carbon nanotubes, and the light-emitting layer 30 includes halide perovskite.

Indium tin oxide (ITO) is a mixture of indium oxide and tin oxide, usually in a mass ratio of 90% indium oxide and 10% tin oxide. Indium tin oxide is transparent and conductive in the form of a thin film.

In the preliminary research and development by the researchers of the present application, it was found that when the second injection layer 50 with light transmission properties is made of a nano-silver wire, the nano-silver wire is easily oxidized at a high temperature to impact the conductivity of the nano-silver wire. In addition, the nano-silver wire will slowly penetrate into the light-emitting layer 30 made of the halide perovskite and chemically react therewith, corroding the halide perovskite and thereby causing the perovskite light-emitting device 100 to fail.

Therefore, after experiments with many materials, the researchers found that carbon nanotubes have good conductivity and stability, and are resistant to high temperature and not easily oxidized, and suitable for various baking processes in the later stage, so they are more suitable for industrial production. When carbon nanotubes are coated on the second transport layer 40, a conductive mesh structure is formed (as shown in FIG. 2), wherein different carbon nanotubes are staggered and overlapped with each other, so that electrons can not only be transported along the direction of the carbon nanotubes themselves, but also can be transported to other carbon nanotubes through the contact sites, and thus the electrons move throughout the carbon nanotubes, to achieve good electrical conductivity of the electrodes, while the holes between different carbon nanotubes allow light to pass through, thereby achieving light transmission. In addition, the transparency of carbon nanotubes can be adjusted by changing the number and the film thickness of the carbon nanotubes.

The researchers of the present application found in experiments that the halide perovskite material has properties such as higher fluorescence quantum efficiency, adjustable optical band gap, and high color purity. Compared with the organic molecular light-emitting layer 30 in an organic light-emitting diode, which needs to be deposited by evaporation coating, the halide perovskite film can be prepared by a low-cost solution method, so the manufacturing cost of the light-emitting device can be greatly reduced. In addition, the researchers of the present application found in experiments that the external quantum efficiency of the green light perovskite light-emitting diodes and the red light perovskite light-emitting diodes exceeded 20% in succession, making it possible for the halide perovskite to be used as the light emitting layer 30.

The light emitted by the light-emitting layer 30 is simultaneously emitted from the first injection layer 10 and the second injection layer 50, thereby achieving the effect of double-sided light emission. The perovskite light-emitting device 100 with a double-sided light-emitting effect will be widely used in the fields of commercial display, advertising display, advertising windows, vehicle glasses, interior decorations, and so on.

The first injection layer 10 is configured to receive injected electrons, the first transport layer 20 is configured to transport electrons to the light-emitting layer, the second injection layer 50 is configured to receive injected holes, and the second transport layer 40 is configured to transport holes to the light-emitting layer 30. Since the work function of indium tin oxide is lower than the work function of carbon nanotubes, the electron injection from the first injection layer 10 will be easier, which will be beneficial to the improvement of the properties of the perovskite light-emitting device 100.

Working principle of the perovskite light-emitting device 100 can be simply divided into the following processes:

1. Under an action of an external electric field, electrons are injected from the first injection layer 10, and holes are injected from the second injection layer 50;

2. The injected electrons migrate from the first transport layer 20 to the light-emitting layer 30, and the injected holes migrate from the second transport layer 40 to the light-emitting layer 30;

3. The electrons and holes meet in the light-emitting layer 30 to generate excitons;

4. The excitons are continuously in a free diffusion motion in the halide perovskite film, and are deactivated in a radiation or non-radiation manner;

5. When the exciton returns to a ground state from an excited state by means of radiative transition, the electroluminescence phenomenon can be observed, and the color of the emitted light is determined by difference in energy level between the excited state and the ground state.

The first injection layer 10 further includes aliphatic amine disposed on the indium tin oxide, and the aliphatic amine is configured to modify the indium tin oxide to reduce a work function of the indium tin oxide. Electrons are injected from the first injection layer 10, and the lower the barrier of the first injection layer 10 is, the faster the electrons are injected. The surface modification of indium tin oxide with aliphatic amine molecules will reduce the work function of indium tin oxide, and reduction in the work function is to reduce the potential barrier of the first injection layer 10.

The first transport layer 20 includes tin dioxide, which is configured to transport electrons to the light-emitting layer 30. Tin dioxide is a metal inorganic oxide. The thermal decomposition temperature of tin dioxide is much higher than that of organic materials. The chemical stability is much better. Therefore, the first transport layer 20 made of tin dioxide is beneficial to the stability of the perovskite light-emitting device 100.

The second transport layer 40 includes polymethyl methacrylate, which is used to transport holes to the light-emitting layer 30. Because the transport rate of electrons in the first transport layer 20 is faster than the transport rate of holes in the second transport layer 40, this will cause that the electrons is injected into the light-emitting layer 30 first, and the holes will be injected slowly, resulting in electron-hole imbalance, Therefore, if high mobility polymethyl methacrylate (PTAA) is used as the hole transport layer, it will facilitate hole transport, and thus have a beneficial effect on the electron-hole injection balance.

Figure 3:
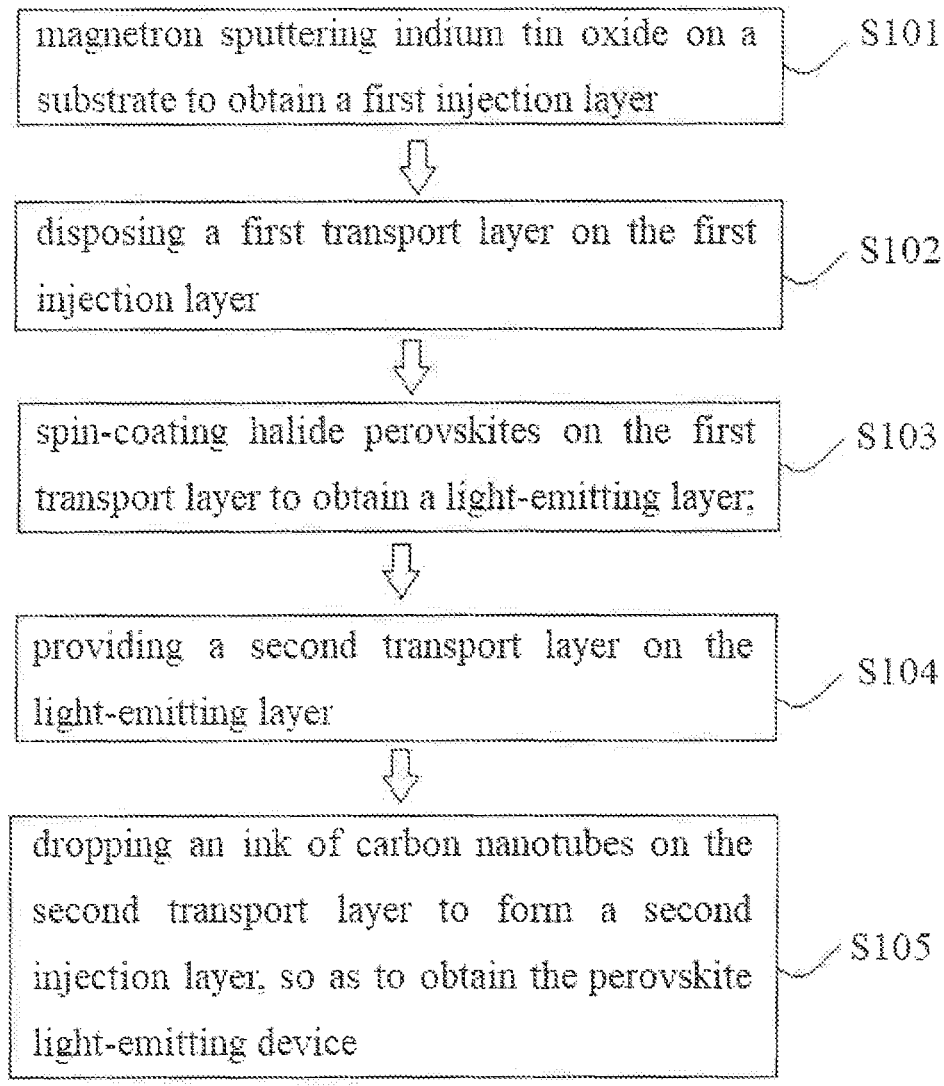
FIG. 3 is a schematic flowchart of a method of preparing a perovskite light-emitting device provided by an embodiment of the present application.

Referring to FIG. 1 and FIG. 3. FIG. 3 is a schematic flowchart of a method of preparing a perovskite light-emitting device 100 provided by an embodiment of the present application.

S101: magnetron sputtering indium tin oxide on a substrate to obtain a first injection layer 10.

The polyethylene terephthalate (PET) or glass is cleaned by ultrasonic cleaning with a 1:1 mixed solution of deionized water and alcohol, and placed in a drying oven for 2 hours to obtain a clean substrate with light transmission properties.

Indium tin oxide is applied on the substrate by means of magnetron sputtering to prepare a transparent first injection layer 10, which may be configured to receive injected electrons.

S102: disposing a first transport layer 10 on the first injection layer 10.

A tin dioxide solution is spin-coated on the first injection layer 10. A rotation speed may be 2000 r/min, and a rotation time may be 50 seconds. Then, the substrate is transferred to a hot stage for annealing to obtain a first transport layer 20. The first transport layer 20 is configured to transport electrons to the light-emitting layer 30.

S103: spin-coating halide perovskites on the first transport layer 20 to obtain a light-emitting layer 30.

The halide perovskite solution is spin-coated on the first transport layer 20. A rotation speed may be 4000 r/min, and a rotation time may be 30 seconds. The anti-solvent chlorobenzene is added dropwise to the first transport layer 20 for extraction, to facilitate precipitation of the halide perovskites for film formation, and the substrate is transferred to a hot stage for annealing to obtain a light-emitting layer 30. The quality of the light-emitting layer 30 obtained by this method is very high, and the light-emitting layer 30 is flat and dense.

S104: providing a second transport layer 40 on the light-emitting layer 30.

A polymethyl methacrylate solution is spin-coated on the light-emitting layer 30. A rotation speed may be 3000 r/min, and the substrate is transferred to a hot stage for annealing to obtain a second transport layer 40. The second transport layer 40 is configured to transport holes to the light-emitting layer 30.

S105: dropping an ink of carbon nanotubes on the second transport layer 40 to form a second injection layer 50, so as to obtain the perovskite light-emitting device 100.

The ink of carbon nanotubes is dropped on the second transport layer 40, and then spin-coated or knife-coated to form a film, followed by drying to obtain the injection layer 50. The second injection layer 50 is configured to receive the injected holes. The fabrication of the perovskite light-emitting device 100 is completed through the steps S101 to S105.

The terms "first" and "second" in the present application are used for descriptive purposes only, and cannot be understood as indicating or implying relative importance or implicitly indicating the number of technical features indicated.

Figure 4:
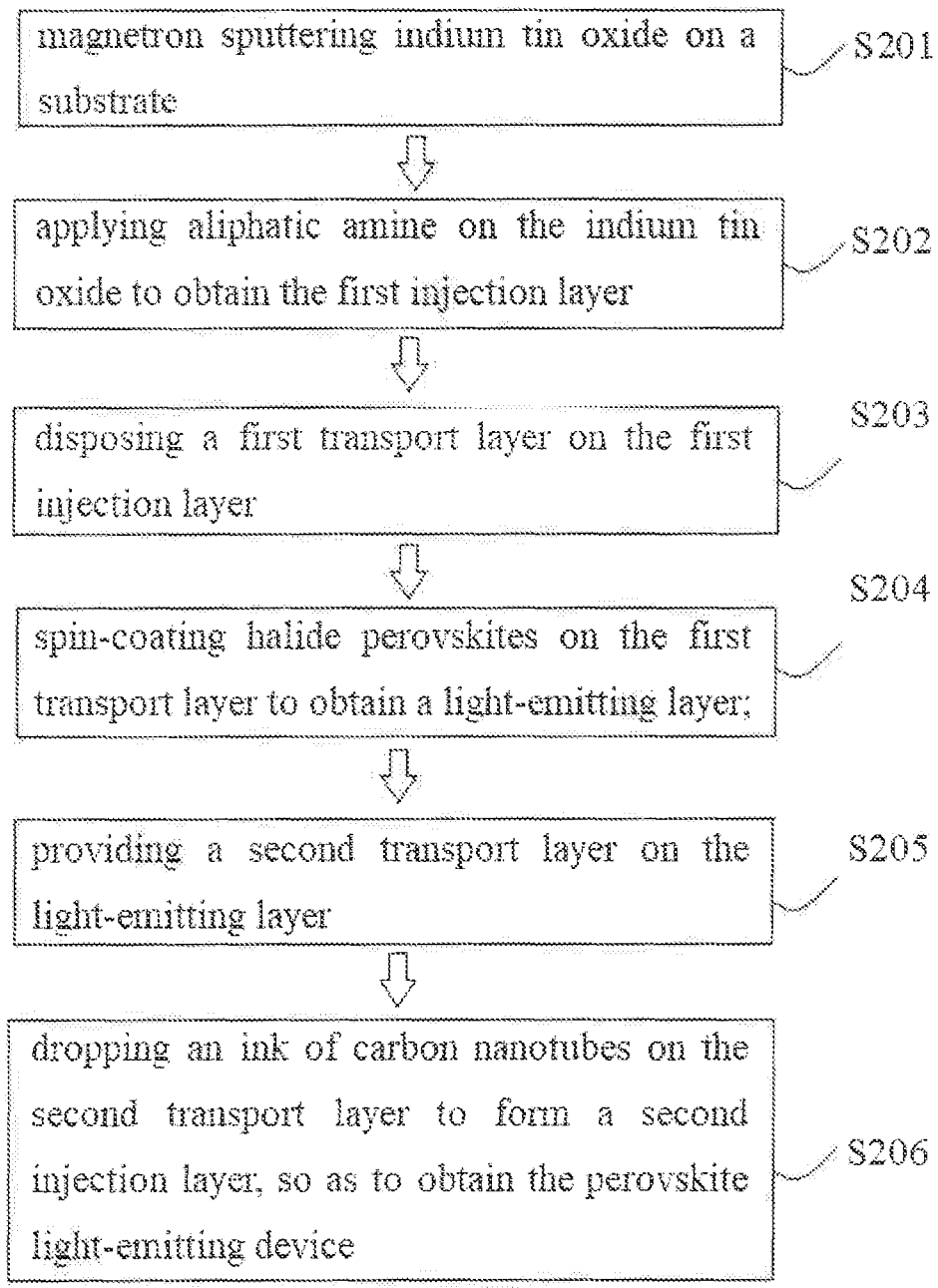
FIG. 4 is a schematic flowchart of a method of preparing a perovskite light-emitting device provided by an embodiment of the present application.

Referring to FIG. 1 and FIG. 4. FIG. 4 is a schematic flowchart of a method of preparing a perovskite light-emitting device 100 provided by an embodiment of the present application.

S201: magnetron sputtering indium tin oxide on a substrate.

The polyethylene terephthalate (PET) or glass is cleaned by ultrasonic cleaning with a 1:1 mixed solution of deionized water and alcohol, and placed in a drying oven for 2 hours to obtain a clean substrate with light transmission properties.

Indium tin oxide is applied on the substrate by means of magnetron sputtering.

S202: applying aliphatic amine on indium tin oxide to obtain a first injection layer 10.

After the indium tin oxide is applied, the aliphatic amine could be further applied on the indium tin oxide to prepare the transparent first injection layer 10. The first injection layer 10 may be configured to receive injected electrons.

The aliphatic amines are used to modify indium tin oxide to reduce the work function of indium tin oxide. Electrons are injected from the first injection layer 10, and the lower the barrier of the first injection layer 10 is, the faster the electrons are injected. The surface modification of indium tin oxide with aliphatic amine molecules will reduce the work function of indium tin oxide, and reduction in the work function is to reduce the potential barrier of the first injection layer 10.

S203: disposing a first transport layer 10 on the first injection layer 10.

A tin dioxide solution is spin-coated on the first injection layer 10. A rotation speed may be 2000 r/min, and a rotation time may be 50 seconds. Then, the substrate is transferred to a hot stage for annealing to obtain a first transport layer 20. The first transport layer 20 is configured to transport electrons to the light-emitting layer 30.

S204: spin-coating halide perovskites on the first transport layer 20 to obtain a light-emitting layer 30.

The halide perovskite solution is spin-coated on the first transport layer 20. A rotation speed may be 4000 r/min, and a rotation time may be 30 seconds. The anti-solvent chlorobenzene is added dropwise to the first transport layer 20 for extraction, to facilitate precipitation of the halide perovskites for film formation, and the substrate is transferred to a hot stage for annealing to obtain a light-emitting layer 30. The quality of the light-emitting layer 30 obtained by this method is very high, and the light-emitting layer 30 is flat and dense.

S205: providing a second transport layer 40 on the light-emitting layer 30.

A polymethyl methacrylate solution is spin-coated on the light-emitting layer 30. A rotation speed may be 3000 r/min, and the substrate is transferred to a hot stage for annealing to obtain a second transport layer 40. The second transport layer 40 is configured to transport holes to the light-emitting layer 30.

S206: dropping an ink of carbon nanotubes on the second transport layer 40 to form a second injection layer 50, so as to obtain the perovskite light-emitting device 100.

The ink of carbon nanotubes is dropped on the second transport layer 40, and then spin-coated or knife-coated to form a film, followed by drying to obtain the injection layer 50. The second injection layer 50 is configured to receive the injected holes. The fabrication of the perovskite light-emitting device 100 is completed through the steps S201 to S205.

Figure 5:
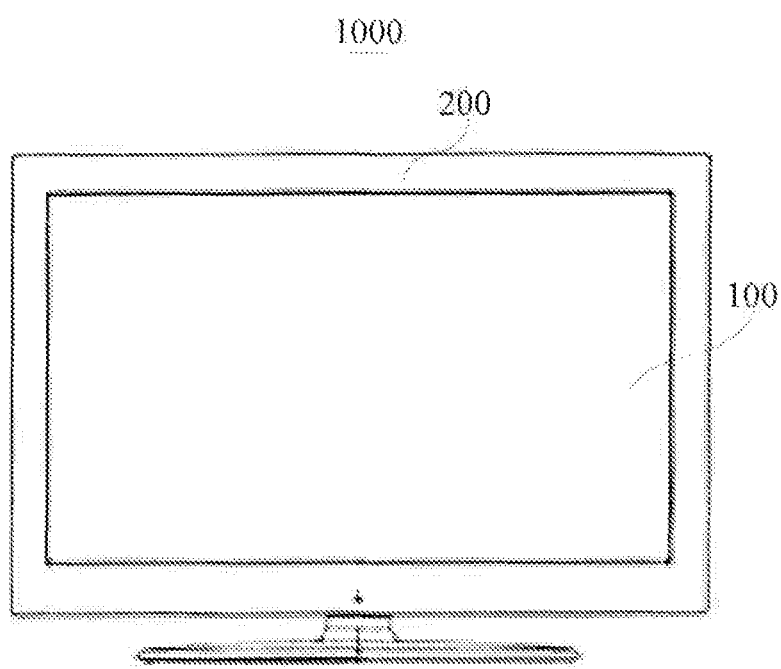
FIG. 5 is a schematic structural diagram of a display provided by an embodiment of the present application.

Referring to FIG. 5, which is a schematic structural diagram of a display 1000 provided be an embodiment of the present application.

The display 1000 of the present application includes the perovskite light-emitting device 100 and the surface frame 200 set around the perovskite light-emitting device 100 provided by the above embodiments. The perovskite light-emitting device 100 can display on double sides.

The above are only examples of the present application, and thus do not limit the patent scope of the present application. Any equivalent structure or equivalent process transformation made by using the description of the application and the contents of the drawings, such as mutual combination of technical features between the embodiments or direct or indirect use of technical features in other related technical fields, is similarly included in the scope of patent protection of the present application.

What is claimed is:

1. A perovskite light-emitting device, comprising a first injection layer, a first transport layer, a light-emitting layer, a second transport layer, and a second injection layer, which are sequentially stacked, wherein the first injection layer comprises indium tin oxide, the second injection layer comprises carbon nanotubes, the light-emitting layer comprises halide perovskite, and light emitted by the light-emitting layer is simultaneously emitted from the first injection layer and the second injection layer.

2. The perovskite light-emitting device according to claim 1, wherein the first injection layer is configured to receive injected electrons, the first transport layer is configured to transport electrons to the light-emitting layer, the second injection layer is configured to receive injected holes, and the second transport layer is configured to transport holes to the light-emitting layer.

3. The perovskite light-emitting device according to claim 2, wherein the first transport layer comprises tin dioxide, which is configured to transport electrons to the light-emitting layer.

4. The perovskite light-emitting device according to claim 2, wherein the first injection layer further comprises aliphatic amine disposed on the indium tin oxide, which is configured to modify the indium tin oxide, to reduce a work function of the indium tin oxide.

5. The perovskite light-emitting device according to claim 2, wherein the second transport layer comprises polymethyl methacrylate, which is configured to transport holes to the light-emitting layer.

6. A display, comprising a perovskite light-emitting device, the perovskite light-emitting device comprising a first injection layer, a first transport layer, a light-emitting layer, a second transport layer, and a second injection layer, which are sequentially stacked, wherein the first injection layer comprises indium tin oxide, the second injection layer comprises carbon nanotubes, the light-emitting layer comprises halide perovskite, and light emitted by the light-emitting layer is simultaneously emitted from the first injection layer and the second injection layer.

7. The display according to claim 6, wherein the first injection layer is configured to receive injected electrons, the first transport layer is configured to transport electrons to the light-emitting layer, the second injection layer is configured to receive injected holes, and the second transport layer is configured to transport holes to the light-emitting layer.

8. The display according to claim 7, wherein the first transport layer comprises tin dioxide, which is configured to transport electrons to the light-emitting layer.

9. The display according to claim 7, wherein the first injection layer further comprises aliphatic amine disposed on the indium tin oxide, which is configured to modify the indium tin oxide, to reduce a work function of the indium tin oxide.

10. The display according to claim 7, wherein the second transport layer comprises polymethyl methacrylate, which is configured to transport holes to the light-emitting layer.

* * * * *